United States Patent [19]
Niehenke et al.

[11] 4,371,851
[45] Feb. 1, 1983

[54] RECEIVER PROTECTOR WITH MULTI-LEVEL STC ATTENUATION

[75] Inventors: Edward C. Niehenke, Elkridge; Gerald I. Klein, Baltimore; Aldo E. Linsenbardt, Catonsville, all of Md.

[73] Assignee: Westinghouse Electric Corp., Pittsburgh, Pa.

[21] Appl. No.: 258,094

[22] Filed: Apr. 27, 1981

[51] Int. Cl.³ .................. H01P 1/22; G01S 13/00
[52] U.S. Cl. ............... 333/17 L; 333/81 A; 333/247; 455/80; 455/217
[58] Field of Search ........... 333/13, 17 L, 81 A, 333/246, 247, 262; 357/74, 81; 455/78, 80-82, 217

[56] References Cited

U.S. PATENT DOCUMENTS

| | | | |
|---|---|---|---|
| 3,972,012 | 7/1976 | Liu | 333/247 |
| 4,010,430 | 3/1977 | Wolfe | 333/81 A |
| 4,232,278 | 11/1980 | Gawronski et al. | 333/17 L X |

OTHER PUBLICATIONS

Chao, *A Matched Microwave Limiter*, IEEE Trans. on MTT, May, 1970, pp. 283, 284.

*Primary Examiner*—Paul L. Gensler
*Attorney, Agent, or Firm*—W. E. Zitelli

[57] ABSTRACT

A radar receiver protector having high isolation and low insertion losses due to a unique microwave assembly configuration is disclosed. The receiver protector includes at least one high power input protection stage and a sensitivity time controlled multi-level attenuation which together achieve rapid switching with a non-critical bias supply and circuit configuration and develop attenuation levels which are invariant with temperature and insensitive to diode parameters.

16 Claims, 11 Drawing Figures

RECEIVER PROTECTOR WITH MULTI-LEVEL STC ATTENUATION

GOVERNMENT RIGHTS CLAUSE

The Government has rights in this invention pursuant to Contract No. F33657-79-C-0040 awarded by the Air Force.

BACKGROUND OF THE INVENTION

The invention relates to receiver protectors for radar systems in general, and more particularly to a receiver protector having high isolation and low insertion loss due to a unique microwave assembly configuration of at least one high power input protection stage and a sensitivity time controlled multi-level attenuator, both achieving rapid switching with a non-critical bias supply and attenuation levels which are invariant with temperature and insensitive to diode parameters.

A typical modern radar is depicted in the schematic block diagram of FIG. 1. Generally, a transmitter section 10 utilizes a power amplifier 12 to generate pulsed or continuous wave energy which is conducted through a conventional circulator 14 and radiated into space from an antenna system 16. Echo signals from targets within the range of the radar are received by the antenna system 16 conducted through the circulator 14 and coupled to a low noise amplifier (LNA) 18 where the received signals are conditioned and thereafter passed along to a receiver section 20. Additionally disposed in a radar between the circulator 14 and low noise amplifier 18 may be a section generally referred to as a receiver protector 22.

Normally, the power amplifier 12 generates signals for transmission with a very high power level. This transmission power is so great that any leakage through the circulator 14 to the LNA 18 may burn out or adversely affect its input stages. One of the functions of the receiver protector 22 is to adequately attenuate any transmission leakage signals to protect the sensitive input of the LNA 18 during the transmission times. In addition, the receiver protector 22 may also provide attenuation during the echo signal receiving time for maximum range performance.

In some radars, a sensitivity time control (STC) section is provided in the receiver protector stage 22 to attenuate the signal level of clutter and other signals at various pre-specified ranges of the radar. This sensitivity time control (STC) attenuation is usually switched between predetermined attenuation levels as a function of pre-specified radar range divisions. To simplify receiver processing, it is preferable that the various attenuation levels of the STC be maintained substantially constant with variations in temperature. In addition, the STC attenuations should be matched to the LNA 18 so that the noise figure and gain thereof remain substantially fixed between the various attenuation levels. It is also preferred that the RP/STC 22 be integrable with the LNA 18 in its implementation in order to minimize size, increase reliability and maximize performance.

An example of operation of the RP/STC 22 in connection with a pulse radar system is depicted in the time waveforms of FIG. 2. Referring to the waveform 2A, pulsed transmissions are shown at 30 and 32 with the interpulse period therebetween designated as 34. The radar echo pulses are received during the interpulse period 34 with the time of reception being indicative of target range. In time waveform 2B, it is shown that the receiver protector (RP) attenuation is provided at time increments 36 and 38 concurrent with the transmission pulses 30 and 32 with little or no attenuation being provided during the interpulse period 34.

The operation of a typical bilevel sensitivity time controlled attenuator is shown in the time waveform 2C. A conventional STC generally adds to the attenuation of the input protection state of the receiver protector during the transmission pulses (30 and 32) and continues to attenuate for a prespecified time during the interpulse periods thereafter. In the interpulse period 34, a first attenuation level of the STC, designated at 40 in waveform 2C, may last for a range division pre-specified from t0 to t1, for example. At range time t1, the STC may switch to a second attenuation level, designated at 42, and may maintain the new attenuation level through the range division t1 through t2, for example. During the interpulse period 34, say from t2 to the next transmission pulse, the STC may afford little to no attenuation of the received echo signals. As shown by the present example, the STC section exemplified may periodically repeat its bilevel attenuation operation for each transmission pulse as shown again in time waveform 2C starting at time t3.

A typical embodiment of an RP/STC is shown schematically in FIG. 3. That shown by the dashed lines 45 is representative of the input protection stage and that shown by the dashed line 47 is representative of the STC stage. A leakage power or received echo signal may enter the circuit at 46 and exit at 48. One input protection section of the stage 45 includes a PIN diode 50 coupled across the transmission line 58 and ground 60 with DC blocking capacitors 55 and 56 coupled in series with the input line 58 on either side of the shunted PIN diode 50. A bias line 62 may be coupled electrically to the anode of the PIN diode 50 and include an inductor 64 and capacitor 66 in series and shunt relationship, respectively, with respect to the bias line 62 and ground 60.

Downstream of the first protection section may be a second section of the stage 45 including another PIN diode 68 and an inductor 70 in parallel shunt connection with the transmission line 58 and ground 60. The STC circuit 47 may include a low level limiter diode 72 coupled across the main transmission line 58 and ground 60. An additional diode 74 with a 50Ω resistor 76 in series therewith may also be disposed in the circuit 47 coupled in parallel with the first limiter diode 72. The diodes 72 and 74 may be driven to conduction by a signal provided over another bias line 78 which includes an inductor 80 and capacitor 82 in a similar circuit configuration as that for the bias line 62. In this circuit, the attenuation of the circuit can be varied from near 0 to the order of 25 dB by varying diode current while the output impedance remains 50Ω, providing a matched attenuator to the LNA 18. For a better understanding of an STC circuit, similar to the one described in connection with the embodiment schematically depicted in FIG. 3, reference is hereby made to an article entitled "A Matched Microwave Limiter" by G. Chao, found in the IEEE Transactions on Microwave Theory and Techniques, May, 1970.

In a typical operation of the RP/STC 22 of FIG. 3, the drive signals over corresponding lines 62 and 78 are provided during the time power is being transmitted like during the pulse widths 30 and 32 as shown in the time waveform 2A. Under these conditions, all of the diodes are conducting and providing attenuation of any power signals being leaked to the circuit 22 during transmission. After transmission, the drive signal 62 may be relieved, but the diodes 72 and 74 of the STC circuit may remain conducting to provide an attenuation state over a pre-specified range division such as that denoted between the times t0 and t1 in the time waveform 2C. As the current delivered to diodes 72 and 74 through line 78 decreases, the RF attenuation is decreased as a function of the series resistance of the diodes. In practice, this attenuation characteristic is very temperature sensitive requiring complex temperature compensation in the drive circuitry to maintain useful accuracy with fast switching. If a current source is used to improve temperature stability, switching speed is compromised.

Presently, two embodiments have been provided for implementing the PIN diode 50 with microstrip circuit techniques. One embodiment is illustrated in cross-sectional view in FIG. 4 and provides for a chip diode 50 to be hermetically sealed in a conventional diode package 90 which may be disposed in a fitted portion 92 of a metallic microwave substrate, such as aluminum, for example. Normally, the microstrip transmission line 58 may include a soft substrate dielectric 57 such as Epsilam 10 or Duroid for low cost construction and the ground 60 or return may be the aluminum substrate. Microwave chip capacitors 55 and 56 may be positioned on the transmission line surface 58 on either side of the package 90. The chip package 90 may be coupled to the chip capacitors 55 and 56 with a pair of fine wires 96. A primary problem with the embodiment of FIG. 4 is that the chip diode 50 within the package 90 is electrically coupled to the external surface of the package 90 with a thin piece of wire ribbon, for example, as shown at 98. Unfortunately, this thin ribbon 98 provides for appreciable impedance levels at the microwave transmission frequencies being attenuated. As a result, instead of the chip diode 50 providing a short across the lines 58 to 60, an undesirable impedance exists which allows unwanted levels of leakage power to continue on downstream.

Since the cause of the aforementioned problem is generally unavoidable being built in at the manufacturing stage of the package diode, another embodiment excluding the use of packaged diodes appears more attractive. A cross-sectional view of an alternate embodiment is shown in FIG. 5. In this second embodiment, an unpackaged chip diode 50 is disposed in a suitably extruded portion 100 of the aluminum substrate 60 having its cathode 102 electrically coupled to the substrate 60. The anode 104 of the chip diode 50 is typically electrically connected to the capacitor chips 55 and 56 with very fine wire ribbons 106. While maintaining the packaged lead inductance problem of the first embodiment (FIG. 4), this second embodiment (FIG. 5) creates some additional new problems. For example, the connection of the wire ribbon 106 to the chip capacitors 55 and 56, at times, require special processing and care. The length of the bond wires 106 is also critical since this length is designed to match the capacitance of the chip diode 50 in series resonance. As a result of this critical matching, when assembling and integrating the receiver protector with the LNA 18, the exposed bonding wires and semiconductor junctions require special handling and processing.

Another problem surfaced as a result of a high power signal being inadvertently supplied to the input of the receiver protector 22, like when the antenna 16 is accidently disconnected during transmission, for example. Under this unusual condition, the thin wire ribbons 96 or 106, acting as a section of the transmission line 58, has a tendency to burn out because of the high currents passing therethrough, much like a microwave fuse, for example. Consequently, the receiver becomes inoperative to all signals. While protection is afforded, it is one of a destructable protection or one shot protection, resulting in a shut-down of the radar for all practical purposes.

From the above, it is evident that another embodiment is needed for the receiver protector circuit, one which can avoid or alleviate the aforementioned problems and provide even greater radar operational integrity.

SUMMARY OF THE INVENTION

In accordance with one aspect of the present invention, a high power input protection stage of a receiver protector includes a semiconductor diode package which is supported in a well section of a metallic ground plane substrate. The package has a base and a lid enclosure, which includes at least one semiconductor diode chip therein. The cathodes and anodes of the diode chips are coupled electrically to the base and lid enclosure, respectively. More specifically, the anodes are coupled to the lid enclosure with a metallic conductor which exhibits significant inductive impedance at the microwave frequencies of the high power input signals being attenuated. The well section of the ground plane substrate is contoured for supporting the diode package substantially upright with the base down within the substrate and with the top surface of the lid enclosure close to the level of the plane of the top surface of the substrate. At least two dielectric microstrip transmission lines are disposed on the top surface of the substrate and extend in different circuit paths from the well section. A chip capacitor having one and another surfaces oppositely disposed, is seated on the top surface of the lid enclosure and makes electrical contact therewith. A conductor section bridges the well section to make electrical contact between the exposed surface of the chip capacitor and the dielectric microstrip transmission paths extending from the well section.

In another aspect of the invention, a sensitivity time control attenuator stage includes a ceramic chip disposed on the surface of a metallic ground plane substrate and having a microstrip transmission line disposed across the top surface thereof to divide it into two sections. The circuit elements of a first diode, a first chip capacitor, and a first microwave resistor are coupled electrically in series on one section of the top surface of the ceramic chip to form a conduction path from the transmission line to the ground plane. Similarly, the elements of a second diode, a second chip capacitor and second microwave resistor are electrically coupled in series on the second section of the top surface of the ceramic chip to form another conduction path from the transmission line to the ground plane. A bias line is disposed on the top surface of the ceramic chip in each of the sections thereof in an approximate quarterwavelength configuration, each having one end electrically coupled to the anode of its corresponding diode. In one embodiment, the first and second diodes are of the beam lead variety. In an alternate embodiment, the first diode may be a chip PIN diode having low parasitic capacitance and disposed on the surface of the transmission line instead of the surface of the ceramic chip.

In still another aspect of the present invention, a receiver protector circuit comprises at least one input protection stage which is disposed between a transmission line and a ground plane. Each input protection stage includes at least one diode, a capacitive element, an approximate quarter-wavelength bias line, and a bias circuit. More specifically, the diode has its cathode coupled to the ground plane and its anode coupled through the capacitive element to the transmission line. The bias line is coupled to the anode of the diode to provide application of a signal to drive the diode into conduction. The bias circuit which is coupled between the bias line and the ground plane provides a first current path for the diode when in a self-conduction condition and a second current path for the diode for expediting recovery from a conduction condition.

Also included in the receiver protector circuit is at least one sensitivity time control attenuation stage which is disposed between the transmission line and ground plane thereof. Each attenuation stage includes at least two conducting paths, each of which couple the transmission line to the ground plane. Each path comprises in series connection a diode having the cathode thereof coupled to the transmission line, a capacitance element, and a microwave resistor having one end coupled to the ground plane. Each attenuation stage further includes an approximate quarter-wavelength bias line coupled to the anode of the diode in each conducting path for providing a signal to drive the corresponding diode into conduction. A common bias current return path, preferably an approximate one-quarter wavelength line, is coupled between the STC transmission line section and the ground plane. Moreover, a bias circuit is coupled to each bias line to provide a first current path for the corresponding diode when in a self-conducting condition and to provide a second current path for the corresponding diode for expediting recovery from a conduction condition.

In one embodiment, the bias lines of the diodes in each of the conducting paths of each sensitivity time control (STC) attenuation stage may be coupled together for application of a common signal to the anodes of the diode pair for simultaneous conduction thereof. When the diodes of the STC circuit are used solely for switching purposes, the size of the microwave resistor in the conducting paths of each attenuation stage sets the attenuation level thereof and moreover, the resistance differential provided between the microwave resistors of each stage sets the impedance matching for optimizing performance. thereof.

DESCRIPTION OF THE PREFERRED EMBODIMENT

Figure 6A:
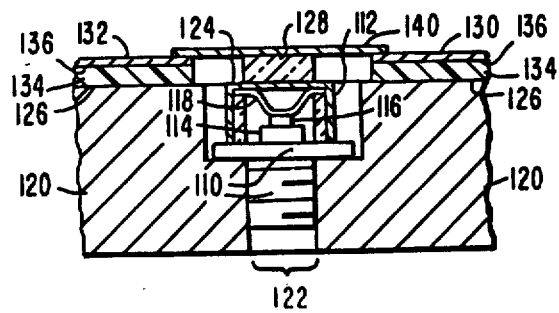
FIGS. 6A and 6B depict cross-sectional and plan views of a microwave assembly embodiment for illustrating one aspect of the present invention.
Figure 6B:
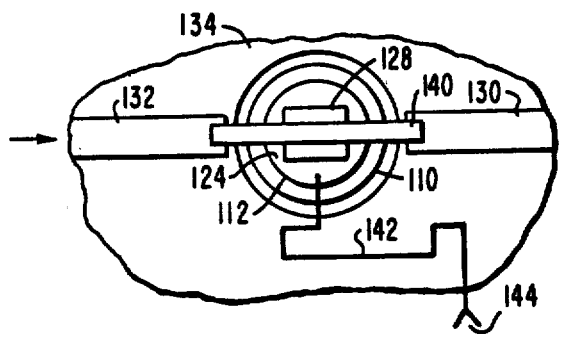

Cross-sectional and plan views of a portion of a high power input protection stage are depicted in FIGS. 6A and 6B, respectively. Referring to FIG. 6A, a conventional semiconductor diode package having a base 110 and a lid enclosure 112 contains at least one semiconductor diode chip therein. The cathode 114 of each diode may be coupled electrically to the base 110 of the diode package. The anode 116 of each diode may be coupled electrically to the lid enclosure 112 with a metallic conductor 118. The base and lid enclosure of the package are electrically isolated from each other. As was described in the Background section hereabove, the metal conductor 118 is known to exhibit significant inductive impedance to signals at the microwave frequencies of the high power receiver signals being attenuated by the input protection stage.

The metallic ground plane substrate 120 has a well section 122 therein which is contoured for supporting the semiconductor diode package comprising elements 110 and 112, substantially upright with the base 110 down within the substrate 120 and with the top surface 124 of the lid enclosure 112 close to the level of the plane of the top surface 126 of the substrate 120. In the preferred embodiment as shown by the diagram of FIG. 6A, the ground plane substrate 120 has its well section 122 threaded so as to accommodate a semiconductor package with a screw base 110. The base 110 of the semiconductor package is preferably made of a copper material to transfer heat quickly to the metal substrate 120, thus providing a good heat sink with low thermal impedance. The semiconductor diode enclosed in the package at 112 is preferably a PIN diode having very low parasitic capacitance. It is understood that while only one diode is shown in the cross-sectional view, other embodiments may include two or even more diodes within the semiconductor package to improve on the thermal impedance and capacitive effects thereof.

Mounted on the top surface 124 of the lid enclosure 112 is a microwave chip capacitor 128. A single-layered or monolithic capacitor, similar to the type manufactured by Dielectric Labs and commonly referred to as a Dicap, is suitable for use as the chip capacitor 128. In the present embodiment, the thickness of the capacitor 128 may be on the order of 3 to 5 mils of ceramic (i.e., a solid monolithic capacitor chip). Moreover, disposed on the top surface 126 of the substrate 120 and extending in different circuit paths from the well section 122 are at least two dielectric microstrip transmission lines 130 and 132. The transmission lines 130 and 132 generally include a dielectric layer 134 lying over the top surface 126 and a metallic conductor surface 136 lying over the surface of the dielectric layer 134.

A conductor section 140 bridges the well section 122 of the substrate 120 and makes electrical contact between the capacitor 128 and dielectric microstrip circuit paths 130 and 132. In the preferred embodiment, the chip capacitor 128 has substantially parallel sides with one side soldered to the top surface 124 of the semiconductor package and the other side soldered to the conductor section 140. The conductor section 140 may be a metallic ribbon or strap connector which is of a material easily solderable to the capacitor 128 and transmission lines 130 and 132. A rugged wire having a diameter of approximately 25 mils may also be suitable for this application.

As shown in the plan view of FIG. 6B, a bias line 142 having an approximate quarter-wavelength configuration may be coupled electrically, like soldering, for example, to the top surface 124 of the lid enclosure 112. The bias line 142 thus provides a high RF impedance level which does not affect the main RF circuit, while providing a path for delivery of a DC or video signal, supplied at 144, to drive the semiconductor diodes into conduction.

In operation, the capacitor element 128 offers DC isolation from the main transmission line which enables the bias line 142 to be coupled electrically to the top surface 124 of the package. Therefore, any DC currents drawn by the semiconductor diode while in a conducting condition either through a controlled drive or a self-drive mode, is isolated from the main line by the blocking capacitor 128. In addition, the value of the capacitor 128 may be chosen to render a series resonant circuit with the net inductance of the semiconductor package (i.e., the lead inductance 118 and other sources). Thus, during conduction, the only impedance between the transmission line and ground plane is the dynamic resistance of the semiconductor diode chip which is dependent on the amount of current flowing therethrough.

Figure 4:
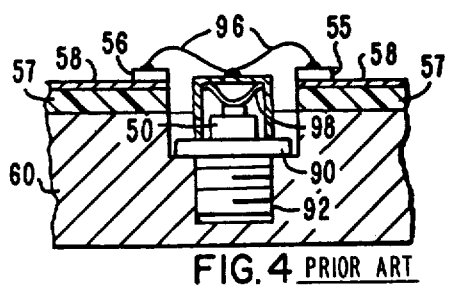
FIGS. 4 and 5 depict cross-sectional views of alternate microwave assembly embodiments of a typical input protection stage of a receiver protector.

The embodiment depicted in FIGS. 6A and 6B is an improvement over the embodiment of FIG. 4 in at least three ways. First, the insertion losses of the chip capacitors 55 and 56, which affected the echo signal reception when the package diode was not conducting, is eliminated in the improved embodiment. In addition, the inductive effects of the internal package lead connection (98 or 118) is removed substantially by the capacitive element 128 which is chosen to be in series resonance therewith. Moreover, the thin leads 96 or 106, the length of which being chosen to achieve a series resonant circuit with the parasitic capacitance of the semiconductor diode chip, is no longer a requirement of the improved embodiment and thus a metallic ribbon or strap conductor 140 may be used in place thereof. Accordingly, in the improved embodiment, the conductor section 140 offers very little inductive impedance by design and can withstand substantially greater currents without fusing or burning out.

Figure 7:
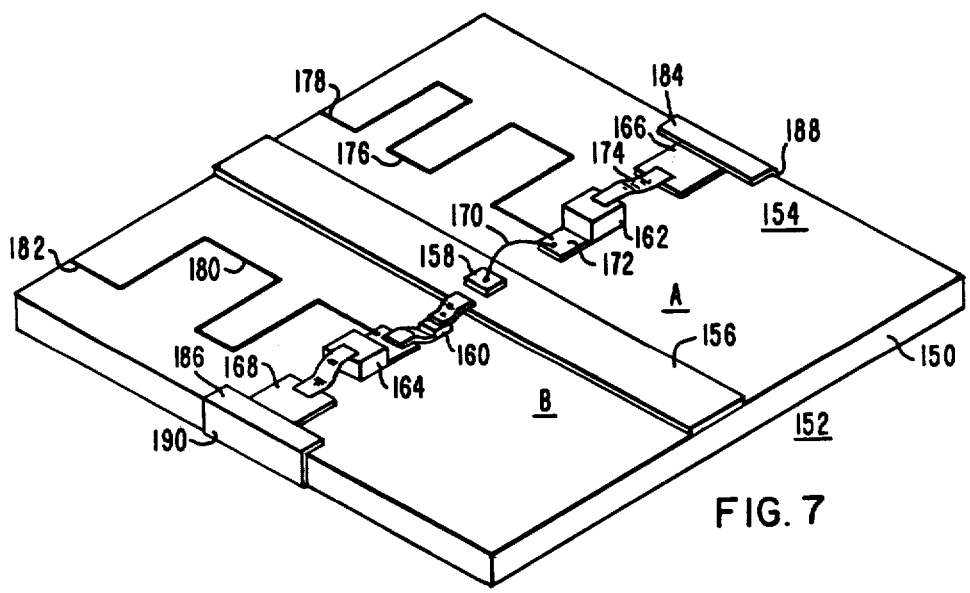
FIG. 7 is an orthogonal view of a microwave assembly embodiment of a portion of a sensitivity time control attenuation stage of a receiver protector for illustrating another aspect of the present invention.

In another aspect of the present invention, a stage of the sensitivity time control attenuator may be embodied as that depicted orthogonally in the sketch of FIG. 7. Referring to FIG. 7, a ceramic chip 150 may be disposed on the surface of a metallic ground plane substrate 152. The exposed top surface 154 of the ceramic chip 150 may have a microstrip transmission line 156 disposed thereacross to divide the top surface 154 in two sections A and B. A diode chip 158 may be disposed on the transmission line 156 with the cathode of the chip making electrical contact with the transmission line 156. A second diode 160, which may be of the beam lead type, for example, may be disposed in the section B of the top surface 154 and have its cathode coupled electrically to the transmission line 156.

In both sections A and B of the top surface 154, there is disposed a chip capacitor 162 and 164 and a microwave resistor 166 and 168. The anode of the chip diode 158 may take electrical contact through a wire lead 170 to one of the conductor leads 172 of the chip capacitor 162. In addition, the other lead conductor 174 of the capacitor chip 162 may be connected to the microwave resistor 166. Also, in section A, a bias line 176 may be connected electrically to the lead 172 and configured to provide an approximate quarter-wavelength impedance to RF signals.

A similar series connection circuit assembly is provided for the elements disposed in section B of the top surface 154. Typically, the anode of the diode 160 is coupled to one lead of the chip capacitor 164 with the other lead thereof being electrically connected to the microwave resistor 168. Similarly, a bias line 180 is disposed in section B having one end connected to the anode of the diode 160 and being configured to effect an approximate quarter-wavelength impedance to RF signals while a drive signal is applied at the other end 182 thereof. The other ends 184 and 186 of the microwave resistors 166 and 168, respectively, may be coupled to the ground plane substrate 152 utilizing respectively corresponding metallic straps 188 and 190 which hang over the ceramic chip 150 providing electrical contact to the substrate 152.

Figure 10:
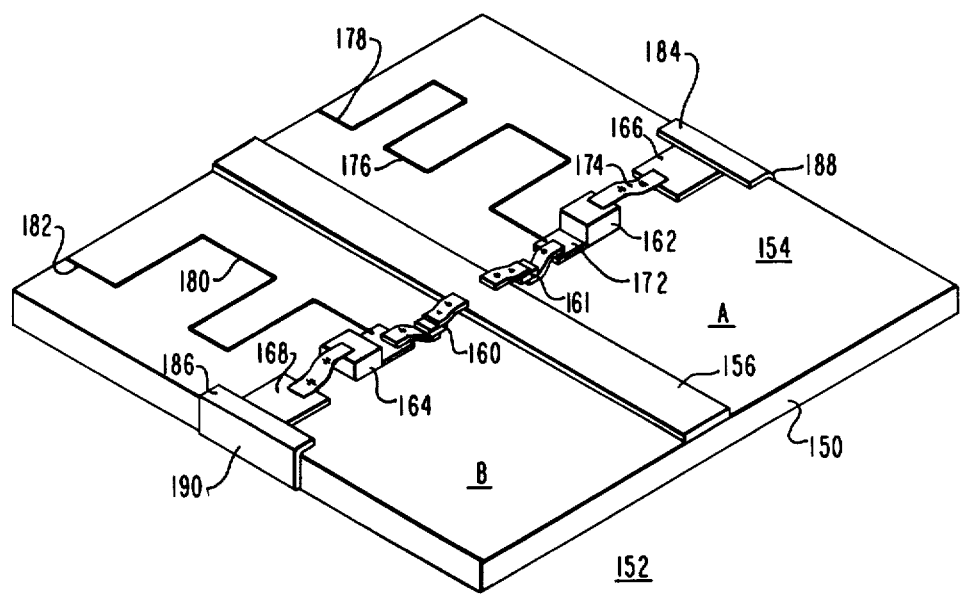
FIG. 10 is an orthogonal view of an alternate microwave assembly embodiment of the portion of the sensitivity time control attenuator stage as depicted in FIG. 7.

In an alternate embodiment as shown in FIG. 10, the chip diode 158 may be replaced with a beam lead diode 161 in a similar assembly configuration as that shown for the beam lead diode 160 in FIG. 7. In this alternate embodiment, the replacement beam lead diode 161 may be disposed in section A of the top surface 154 having its cathode and anode leads connected to the transmission line 156 and capacitor lead 172, respectively.

Figure 8:
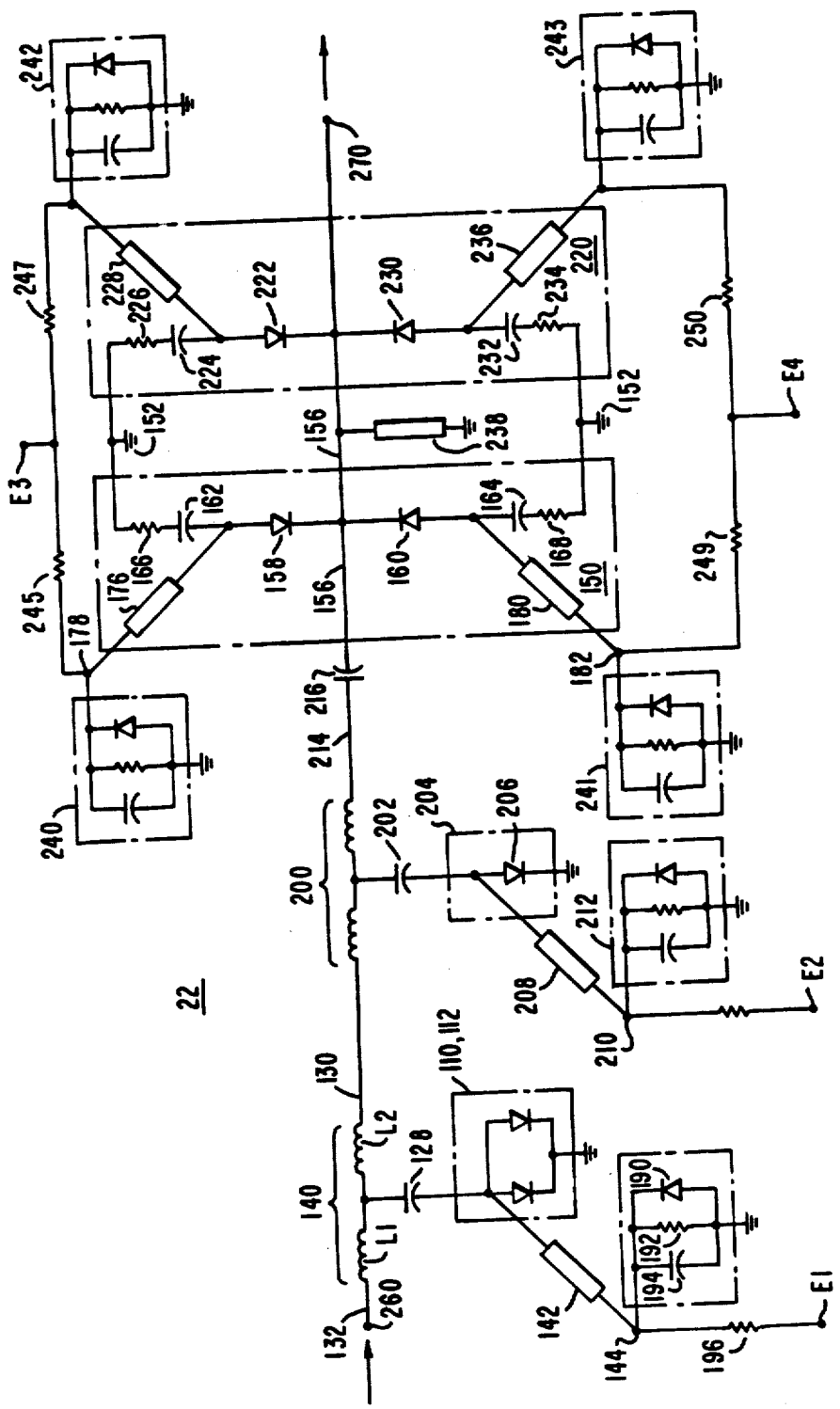
FIG. 8 is a schematic diagram of a receiver protector circuit suitable for embodying the principles of applicants' invention.
Figure 9:
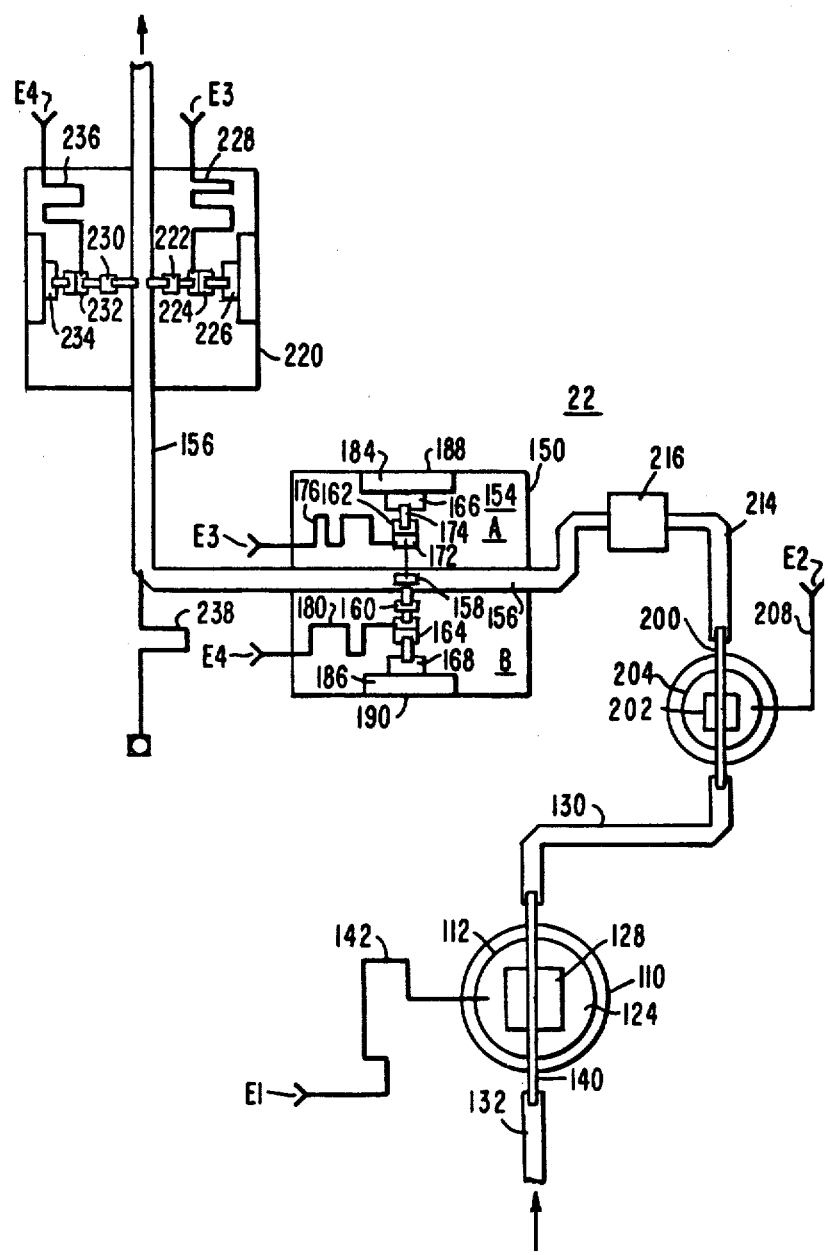
FIG. 9 is a plan view of a microwave microstrip assembly suitable for embodying the circuit elements of the receiver protector circuit depicted in FIG. 8.

An RP/STC 22 suitable for embodying the principles of applicants' invention is shown schematically in FIG. 8. A plan view of a typical assembly of the microwave circuit embodiment of FIG. 8 is depicted in FIG. 9. Two high power input stages for protection are included in the embodiments of FIGS. 8 and 9 along with a bilevel STC attenuation circuit. Referring to FIG. 8, the drawing numerals denoting the various elements of the embodiment are consistent with the drawing numerals of the previously-described embodiments in FIGS. 6A, 6B and 7.

In the first input protection stage, the inductances L1 and L2 depict the functional equivalents of the wire conductor 140 bridging the well section 122 (see FIG. 6A). A parallel pair of semiconductor PIN diodes are shown enclosed by dashed lines which denote the semiconductor package consisting of the base 110 and lid enclosure 112. The capacitor 128 is shown electrically coupled between the transmission line consisting of circuit paths 132 and 130 and the anodes of the diodes within the semiconductor package. The cathodes of the packaged diodes are connected to the ground plane via base 110 screwed into the substrate 120. The bias line 142 is connected to the anodes of the packaged diodes at one end and has coupled to the other end 144 thereof a bias circuit comprising the elements of a diode 190, a resistor 192 and a capacitor 194 all connected in parallel to the ground plane 120 with the anode of the diode 190 coupled to the ground plane. A drive signal E1 may be applied at times, to the end 144 of the bias line 142 through a resistive element 196.

Another input protection stage may be included in the receiver protector 22 electrically connected to the first input protection stage by the circuit path 130. Referring to FIGS. 8 and 9, the second input protection stage includes a wire conductor 200 bridging the well section thereof along with a capacitive element 202 seated on the top surface of the semiconductor package 204 which includes a PIN diode 206 having its cathode connected to the ground plane. A bias line 208 may be coupled to the anode of the diode 206 at one end. A drive signal E2 may be applied at the other end 210 thereof which includes a bias circuit 212 comprising a similar bias circuit arrangement as that described for the first input protection stage.

The STC attenuation circuit of the present embodiment may be coupled to the input protection stages by a transmission circuit path 214, a blocking capacitor 216 and the transmission circuit path 156. The circuitry of the STC embodiment which is shown enclosed within the dashed lines 150 is consistent with that described in connection with the embodiment of FIG. 7 maintaining the reference numerals of the circuit elements included therein. A similar circuit arrangement is shown for the STC embodiment enclosed within the dashed lines 220.

In the second circuit arrangement 220 a series connection of elements including a diode 222, a capacitor 224 and a microwave resistor 226 form a conduction path between the transmission line 156 and the ground plane 152. A bias line 228 is coupled to the anode of the diode 222. A second conduction path is formed by the series connection of another group of elements including a diode 230, a capacitor 232 and a microwave resistor 234 and couples the transmission line 156 to the ground plane 152. Another bias line 236 is coupled to the anode of the diode 230.

Between the first and second STC circuit arrangements 150 and 220, respectively, may be included a common bias current return path 238 for the bias signals applied to the diodes 158, 160, 222, and 230. In the present embodiment, an approximate quarter-wavelength line 238, coupled between the transmission line 156 and ground plane 152, is used for this purpose and provides high impedance to the RF signals conducted over the transmission line 156.

Each of the bias lines 176, 180, 228, and 236 have bias circuits 240, 241, 242, and 243, respectively coupled between the inputs thereof and the ground plane 152. The circuit elements and circuit arrangements of the bias circuits 240-243 are similar to the bias circuit described in connection with the first input stage of the receiver protector. The diodes 158 and 222 may be driven into conduction through their corresponding bias lines 176 and 228 by a common drive signal E3. Likewise, the diodes 160 and 230 may be driven into conduction through their corresponding bias lines 180 and 236 by a common drive signal E4. The drive signal E3 may be applied to the bias lines 176 and 228 through respective resistor elements 245 and 247 and similarly, the drive signal E4 may be applied to the bias lines 180 and 236 through corresponding resistor elements 249 and 250.

Figure 1:
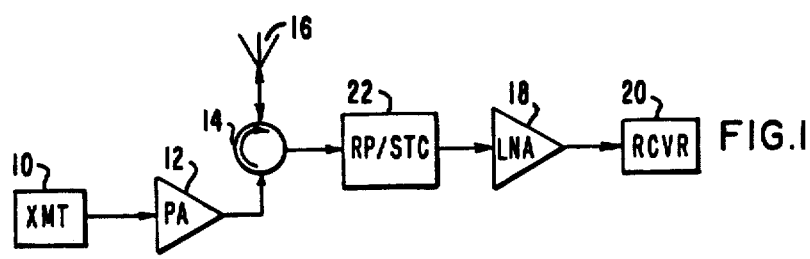
FIG. 1 is a block diagram schematic embodiment of a typical radar.
Figure 2:
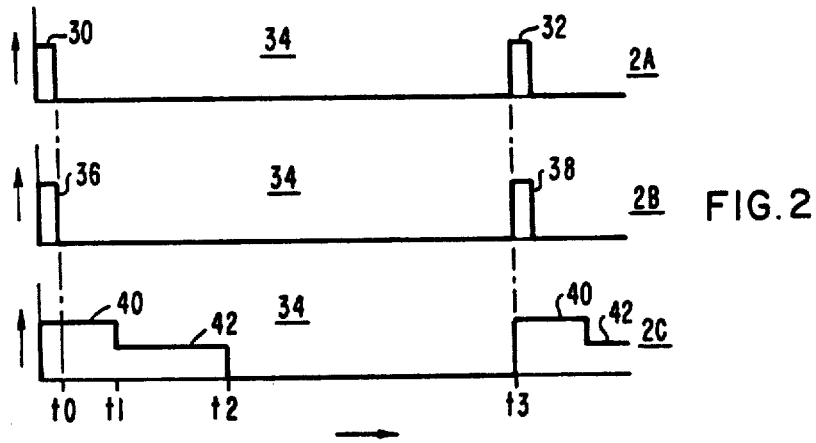
FIG. 2 includes time waveforms 2A, 2B and 2C which illustrate a typical operation of a receiver protector stage of a radar typically depicted in FIG. 1.
Figure 3:
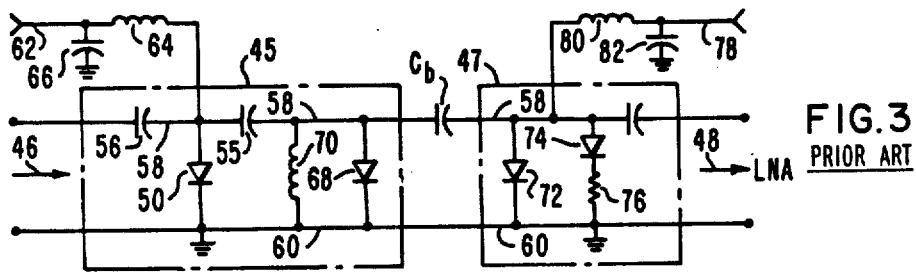
FIG. 3 is a circuit schematic of a known receiver protector suitable for use in the embodiment of FIG. 1.

A typical operation of the RP/STC 22 of the embodiments of FIGS. 8 and 9 is described herebelow with reference to the time waveforms of FIG. 2. Referring to FIG. 8, the leakage transmission power signal and the echo reception signals may be coupled to the circuit 22 through the port 260 and the conditioned signals may exit the circuit 22 at port 270 on their way to the LNA circuit 18, for example. At high power signal inputs 260, like for example, when the transmitter 10 is transmitting a signal through the circulator 14 to the antenna 16 and a portion of the signal is leaked to the circuit 22 (see FIG. 1), the drive signals E1, E2 and E3 or E4 may be applied to the corresponding semiconductor diodes to render a conduction condition therein. As the corresponding diodes go into forward conduction, the resistance state thereof becomes very low. The capacitive elements in series with their corresponding semiconductor diodes are designed in size and value to be in series resonance with the net inductance of the diode packages for at least a predetermined bandwidth about the microwave frequencies being attenuated. As a result of these elements canceling out substantially their respective impedance contributions, a virtual short circuit is imposed across the transmission line to ground to clamp the high power leakage input signals from entering the sensitive input stages of the LNA circuit 18. In the preferred embodiment, the impedance matching between the capacitive elements and the net inductance of the diode packages is adequate for approximately 20% of the wide microwave frequency bandwidth generally centered about the microwave transmission frequency. Test results have indicated that the two input stages as shown in FIGS. 8 and 9 offer approximately 24 dB and 20 dB, respectively, of attenuation to a high power input signal imposed thereon.

At the end of the transmission pulse denoted by time t0 in FIG. 2, the radar starts receiving echo signals from targets. As the drive signals E1, E2 are deenergized, the R and C elements of the bias circuits associated therewith provide a first current path in parallel to expedite the turning off of the semiconductor diode switches, respectively, corresponding thereto.

Figure 5:
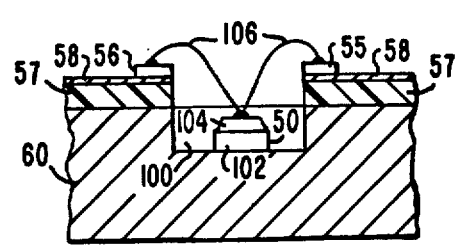

During the reception period of the radar, the semiconductor diodes of the input protection stages are open-circuited allowing no current to flow therethrough. Thus, the echo signal currents flow only through the transmission current paths 132, 130, 214. Note that the capacitive elements 128 and 202 (see FIGS. 4 and 5) are no longer in the transmission path and offer no contribution to the insertion losses to the input microwave signals.

During the reception time t0 to t1, for example, the drive signal E3 may be sustained while the drive signal E4 may be removed. In this state, diodes 158 and 222 are conducting and diodes 160 and 230 are not conducting or open-circuited. With the diodes 158 and 222 in a conduction state, the STC attenuation circuit offers a relatively high attenuation (level 40) to the reception signals flowing over transmission path 156. At time t1, for example, the drive signal E3 may be removed and E4 may be energized to render the diodes 158 and 222 in a nonconduction state and diodes 160 and 230 in a conduction state. With the diodes 160 and 230 conducting, a different attenuation level 42 results as illustrated by the exemplary time waveform 2C in FIG. 2.

The resistors 226 and 234 of the STC embodiment may be designed at a predetermined resistance greater than their resistive counterparts 166 and 168, respectively. This predetermined resistance is consistent with optimizing microwave signal transfer utilizing well-known microwave impedance matching techniques.

The overall absolute values of the microwave resistors 166, 226 and 168, 234 set the attenuation levels as shown by 40 and 42 in the time waveform 2C. In effect, the corresponding semiconductor diodes act merely as "on-off" switches. Note that the blocking capacitors are in series with the conduction paths between the transmission line and the ground plane and offer no insertion losses to the signals flowing through the transmission circuit path 156 on their way to the LNA circuit 18. These capacitors are also chosen in value to series resonate the net inductance of the microwave elements in their respective conduction paths between the transmission line 156 and ground plane 152. For example, capacitor element 162 resonates inductive effects of diode 158 and resistor 166. The capacitive element of the bias circuits 240-243 offers an RF ground for the corresponding quarter-wavelength bias line 176, 180, 228 and 236 coupled thereto. In addition, the R and C elements of the bias circuits provide a current path for expediting the switching off of the diodes correspondingly connected thereto.

For unsynchronized operation, like large signal returns during the interpulse period 34, for example, or under the conditions of a failure of the bias signal, the semiconductor diode elements of the input detection stages and the STC stages become self-conducting or self-limiting. As the RF current builds up in the corresponding diodes, conduction is initiated. In order for the conduction to continue, a return current path is needed. This is accomplished in the present embodiment (FIGS. 8 and 9) with the diode elements, like 190, for example, in the bias circuits which provide a second current path from the ground plane through their corresponding bias lines into the anodes of the diodes respectively associated therewith. Accordingly, the overall receiver protector circuit 22 permits both self-conduction of the diodes for extreme emergency cases and drive conductance of the diodes during normal operational modes.

The advantages offered by the present embodiment are: (1) the insertion losses of the protective circuit elements have been significantly reduced and the isolation between the transmission line and ground plane improved because of the circuit placement of the blocking diodes and the extremely low parasitic capacitance of packaged semiconductor diodes used; (2) the first and second current conduction paths offered by the bias circuits both expedite the switching off of the semiconductor diodes and provide for the return current path for self-conduction of the diodes as well; (3) the provisions of a rugged wire conductor connecting the input protection stages to the transmission circuit paths offers both the conduction of high current levels and extremely low inductive impedances; (4) the utilization of the semiconductor diodes in the STC circuit paths as "on-off" switches eliminates the dependence on the dynamic resistance of the diodes permitting the various attenuation levels to be set solely by the values of the microwave resistors, and (5) the necessary matching impedances to optimize microwave signal transmission is provided by the difference in the resistance values of the microwave resistor pairs of the STC embodiment.

While the embodiments described in connection with FIGS. 8 and 9 show only two input protection stages and two levels of attenuation for the STC stage, it is understood that the embodiment may be modified by anyone skilled in the pertinent art with the above teachings to include only one stage of input protection or more than two stages, or just one stage of level attenuation or more than two levels of attenuation, as the case may be. Consequently, the present invention should not be limited to any one embodiment but should be construed in connection with the broad scope and breadth of the claims heretofollow.

We claim:

1. A receiver protector stage of a radar for attenuating high power input signals, said stage including:
   a semiconductor diode package having a base and a lid enclosure, said lid enclosure containing at least one semiconductor diode chip therein, a cathode of said diode being coupled electrically to said base and an anode of said diode being coupled electrically to said lid enclosure with a metallic conductor which exhibits significant inductive impedance at the microwave frequencies of the high power input signals being attenuated;
   a metallic ground plane substrate having a well section contoured for supporting said semiconductor diode package substantially upright with base down within said substrate and with the top surface of said lid enclosure close to the level of the plane of the top surface of said substrate;
   at least two dielectric microstrip transmission lines disposed on the top surface of said substrate and extending in different circuit paths from said well section;
   a chip capacitor having one and another surfaces oppositely disposed, said chip capacitor being seated on the top surface of said lid enclosure with one surface of said chip capacitor in electrical contact with said lid enclosure top surface; and
   a conductor section bridging said well section to make electrical contact between the another surface of said chip capacitor and said dielectric microstrip transmission paths extending from said well section.

2. A receiver protector stage in accordance with claim 1 including a bias line of an approximate quarter-wavelength impedance configuration coupled electrically at one end to the lid enclosure of the semiconductor package, said bias line being utilized to provide a drive signal to the diode package for rendering the at least one diode contained therein in a conduction condition.

3. A receiver protector stage in accordance with claim 1 wherein the chip capacitor is a parallel plate ceramic capacitor.

4. A receiver protector stage in accordance with claim 1 wherein the semiconductor package is a hermetically sealed package having a screw base comprising a high heat transfer metallic material; and wherein the well section of the ground plane substrate includes a threaded section for screwing the base of the semiconductor package therein to support the package in its upright position.

5. A receiver protector stage in accordance with claim 1 wherein the at least one semiconductor diode chip is of the type which exhibits low parasitic capacitance.

6. A receiver protector stage in accordance with claim 1 wherein the size of the chip operator is consistent with a capacitive reactance value in series resonance with the net inductive reactance of the semiconductor package for a predetermined frequency bandwidth about the microwave frequency of the high power input signal being attenuated.

7. A sensitivity time control (STC) attenuator stage of a radar comprising:
- a metallic ground plane substrate;
- a ceramic chip disposed on the surface of said substrate and having an exposed top surface;
- a microstrip transmission line disposed across the top surface of said ceramic chip to divide said top surface in two sections;
- a first diode disposed on said transmission line with the cathode thereof making electrical contact with said transmission line;
- a first chip capacitor disposed on the top surface of said ceramic chip in one section thereof;
- a first conductor section for making contact between the anode of said first diode and one side of said first chip capacitor;
- a first bias line disposed on the top surface of said ceramic chip in the one section thereof in an approximate quarter-wavelength configuration having one end electrically coupled to the anode of said first diode;
- a first microwave resistor disposed on the top surface of said ceramic chip in the one section thereof and being coupled electrically between the other side of said first chip capacitor and said ground plane substrate;
- a second diode disposed on the top surface of said ceramic chip in the other section thereof and having the cathode thereof electrically coupled to said transmission lines;
- a second chip capacitor disposed on the top surface of said ceramic chip in the other section thereof;
- a second conductor for making contact between the anode of said second diode and one side of said second chip capacitor;
- a second bias line disposed on the top surface of said ceramic chip in the other section thereof in an approximate quarter-wavelength configuration having one end electrically coupled to the anode of said second diode; and
- a second microwave resistor disposed at the top surface of said ceramic chip in the other section thereof and being coupled electrically between the other side of said second chip capacitor and said ground plane substrate.

8. An STC attenuator stage in accordance with claim 7 wherein the first diode is a chip PIN diode having low parasitic capacitance; and the second diode is a beam lead diode.

9. A sensitivity time control (STC) attenuator stage of a radar comprising:
- a metallic ground plane substrate;
- a ceramic chip disposed on the surface of said substrate and having an exposed top surface;
- a microstrip transmission line disposed across the top surface of said ceramic chip to divide said top surface in two sections;
- a first diode disposed on the top surface of said ceramic chip in one section thereof and having the cathode thereof coupled electrically to said transmission line;
- a first chip capacitor disposed on the top surface of said ceramic chip in said one section thereof;
- a first conductor for making contact between the anode of said first diode at one side of said first chip capacitor;
- a first bias line disposed in the top surface of said ceramic chip in the one section thereof in an approximate quarter-wavelength configuration having one end electrically coupled to the anode of said first diode;
- a first microwave resistor disposed on the top surface of said ceramic chip in the one section thereof and being coupled electrically between the other side of said first chip capacitor at said ground plane substrate;
- a second diode disposed on the top surface of said ceramic chip in the other section thereof and having the cathode thereof electrically coupled to said transmission line;
- a second chip capacitor disposed on the top surface of said ceramic chip in the other section thereof;
- a second conductor for making contact between the anode of said second diode and one side of said second chip capacitor;
- a second bias line disposed on the top surface of said ceramic chip in the other section thereof in an approximate quarter-wavelength configuration having one end electrically coupled to the anode of said second diode; and
- a second microwave resistor disposed on the top surface of said ceramic chip in the other section thereof and being coupled electrically between the other side of said second chip capacitor and said ground plane substrate.

10. An STC attenuator stage in accordance with claim 9 wherein the first and second diodes are packaged as beam lead types.

11. A receiver protector circuit disposed in a radar between the transmitter and receiver sections thereof for protecting the input stages of said receiver against leakage power and strong echo reception signals, said circuit comprising:
- a transmission line;
- a ground plane;
- at least one input protection stage, disposed between said transmission line and ground plane, including:
  - at least one diode having its cathode coupled to said ground plane;
  - a capacitive element coupled between the anode of said diode and said transmission line;
  - an approximate quarter-wavelength bias line coupled to the anode of said diode to provide application of a signal to drive said diode into conduction; and
  - a bias circuit coupled between said bias line and said ground plane to provide a first current path for the diode when in a self-conduction condition and to provide a second current path for the diode for expediting recovery from a conduction condition; and
- at least one sensitivity time control (STC) attenuation stage, disposed between said transmission line and ground plane, including:
  - at least two conducting paths, each coupling said transmission line to said ground plane, each comprising in series connection:
    - a diode having the cathode thereof coupled to the transmission line;
    - a capacitance element; and
    - a microwave resistor having one end coupled to said ground plane;
  - an approximate quarter-wavelength bias line coupled to the anode of said diode in each conducting path for providing a signal to drive said corresponding diode into conduction; and a bias circuit coupled between each bias line and said ground plane to provide a first current path for the corresponding diode when in a self-conducting condition and to provide a second current path for the corresponding diode for expediting recovery from a conduction condition.

12. A receiver protector circuit in accordance with claim 11 wherein the first current path of each bias circuit includes a diode having its cathode coupled to the corresponding bias line and its anode coupled to the ground plane; and wherein the second current path of each bias circuit includes a resistor and capacitor in a parallel connection.

13. A receiver protector circuit in accordance with claim 11 wherein the bias lines of the diodes in each of the conducting paths of each STC attenuation stage are coupled together for application of a common signal to the anode of the diode pair for simultaneous conduction thereof.

14. A receiver protector circuit in accordance with claim 13 wherein the size of the microwave resistor in the conducting paths of each STC attenuation stage sets the attenuation level thereof; and wherein a predetermined resistance differential is provided between the microwave resistors of an STC attenuation stage for impedance matching performance thereof.

15. A receiver protector circuit in accordance with claim 11 including:
    a blocking capacitive element disposed in the transmission line between the at least one input protection stage and the at least one STC attenuation stage; and
    a common bias current return path coupled from the transmission line section of the STC stage to the ground plane, said return path offering high impedance to the microwave signals conducted over the STC transmission line section.

16. A receiver protector circuit in accordance with claim 15 wherein the return path includes an approximate one-quarter wavelength line coupled between the transmission line and ground plane.

* * * * *